United States Patent [19]
Renz

[11] Patent Number: 5,410,251
[45] Date of Patent: Apr. 25, 1995

[54] HIGH-FREQUENCY SYSTEM FOR NUCLEAR SPIN TOMOGRAPHY WITH SHIELD FOR DELIMITATION OF AN ELECTRIC FIELD

[75] Inventor: Wolfgang Renz, Erlangen, Germany
[73] Assignee: Siemens Aktiengesellschaft, München, Germany
[21] Appl. No.: 235,724
[22] Filed: Apr. 29, 1994

[30] Foreign Application Priority Data
Apr. 30, 1993 [DE] Germany ......... 43 14 338.5

[51] Int. Cl.⁶ ............................................. G01V 3/00
[52] U.S. Cl. ..................................... 324/318; 324/322
[58] Field of Search ............. 324/318, 319, 320, 322, 324/307, 309; 128/653.5

[56] References Cited

U.S. PATENT DOCUMENTS

| | | | |
|---|---|---|---|
| 3,277,488 | 10/1966 | Hoffman | 343/771 |
| 3,495,265 | 2/1970 | Smith | 343/911 |
| 4,636,730 | 1/1987 | Bottomley | 324/318 |
| 4,839,594 | 6/1989 | Misic et al. | 324/318 |
| 4,878,022 | 10/1989 | Carlson | 324/318 |
| 4,978,920 | 12/1990 | Mansfield et al. | 324/318 |
| 5,028,872 | 7/1991 | Nakabayashi | 324/318 |
| 5,047,787 | 9/1991 | Hogberg | 343/841 |

FOREIGN PATENT DOCUMENTS

| | | |
|---|---|---|
| 0047065 | 3/1982 | European Pat. Off. |
| 0073375 | 12/1986 | European Pat. Off. |
| 1566148 | 10/1974 | Germany . |
| 3223736 | 2/1983 | Germany . |
| 3426038 | 1/1985 | Germany . |
| 3642226 | 6/1987 | Germany . |
| 3807178 | 9/1988 | Germany . |
| 3835805 | 4/1990 | Germany . |
| 3839046 | 5/1990 | Germany . |
| 4113120 | 11/1992 | Germany . |
| WO91/19455 | 12/1991 | WIPO . |

OTHER PUBLICATIONS ntz vol. 41 (1988), No. 5, pp. 280-283, Hans Dominik, Eberhard Eckert: *Hochfrequenzabsorbierende Materialien.*
ntz Archiv, vol. 11 (1989), No. 5, pp. 237-243, Wilhelm Dürr et al.: *Hochfrequenzsysteme fur die Kernspintomographie.*
Hütte Des Ingenieurs Taschenbuch, vol. IV A (1957), pp. 802-803, by Akademischen Verein Hütte, E. V., Berlin, DE.
Lexikon Der Physik, by Hermann Franke, (1969) pp. 266-268, Franckh'sche Verlagshandlung, Stuttgart, DE.
DIN VDE 0335 (1988), Part 1, pp. 2-4, Part 3, pp. 2-6.

*Primary Examiner*—Louis Arana
*Attorney, Agent, or Firm*—Kenyon & Kenyon

[57] ABSTRACT

A high-frequency apparatus for nuclear spin tomography includes a high-frequency antenna arrangement in the region of a biological body to be imaged. Such an apparatus often exhibits an undesirable electric field coupling between the antenna arrangement and the body. To avoid the effects of such a coupling, the present invention provides at least one plate-shaped or layer-shaped shielding element consisting of a dielectric material with an $\epsilon_r$ of at least 50 and a tan $\delta$ of at most $2.5 \times 10^{-2}$. This shielding element is arranged at least in a region of increased electric field strength prevailing on the antenna arrangement.

10 Claims, 3 Drawing Sheets

HIGH-FREQUENCY SYSTEM FOR NUCLEAR SPIN TOMOGRAPHY WITH SHIELD FOR DELIMITATION OF AN ELECTRIC FIELD

BACKGROUND OF THE INVENTION

The present invention relates to the field of nuclear spin tomography, and in particular to a shield for delimiting an electric field in a high-frequency apparatus for nuclear spin tomography. An apparatus of a type to which the present invention relates includes a high-frequency antenna for exciting nuclear spin in a biological body to be examined and for receiving high-frequency signals produced by the nuclear spin excitation. Such systems often include a shielding means arranged between the antenna and the body to delimit an electric field coupling. An exemplary system is disclosed in European Patent A-0 047 065.

As is known in the art, nuclear magnetic resonances may be used to produce cross-sectional images of a biological object to be examined, such as a human body or part of a body. The body to be examined is brought into a strong, homogeneous magnetic field, called the base field, which produces within the body an alignment of nuclear spins of atomic nuclei, and particularly of hydrogen atom nuclei (that is, protons) bound to water. These nuclei are then excited by high-frequency excitation pulses into a precessional movement. At the end of each exciting pulse, the atomic nuclei precess with a frequency which is dependent on the intensity of the base field. After a predetermined period of relaxation, and based on their spin, the., nuclei move in pendulum fashion back into a preferred direction established by the base field. Using computer and/or measurement analysis of the integral, high-frequency nuclear signals, an image can be produced from the three-dimensional spin density or from the distribution of the relaxation times within a layer of the body. Linear field gradients are used to associate the nuclear resonance signals detectable as a result of the precessional movements with the specific site of their origin. For this purpose, the corresponding gradient fields are superimposed on the base field and controlled so that excitation of the nuclei takes place only in the layer to be imaged. Imaging based on these physical effects is known as nuclear spin tomography (NST) or nuclear magnetic resonance (NMR) tomography.

Tomography systems generally require a transmitter with a corresponding antenna to generate the high-frequency excitation of the nuclear spin. As disclosed in Wilhelm Dürr et al., *High Frequency System for Nuclear Spin Tomography*, ntz Archiv, Vol. 11, No. 5 at 237–243 (1989) and European Patent B-0 073 375, the antenna can be implemented as a whole-body resonator. For this purpose, the transmitting antenna is developed as a resonant circular (hollow) waveguide antenna. It therefore has several electric conductor elements extending parallel to the cylinder axis of the base-field magnet, which is developed as a solenoid. These conductor elements are surrounded by a common envelope tube, or HF-screen, made from a material exhibiting good electrical conductivity, and which is pervious to the low-frequency gradient fields but impervious to the high-frequency field. Resonant oscillation conditions are established for the transmission within this circular waveguide antenna.

Where regions of relatively limited extent are to be imaged, a surface coil or local coil may be placed on the part of the body being examined, such as a vertebra, the middle ear or an eye. In a simplest case, such a local coil consists of a circular wire loop with at least one separation bridged by a capacitor and connected in high-frequency. In general, such a local coil is used only to receive the high-frequency signals produced by the nuclear-spin excitation. The nuclear spin itself is generated by a transmitting antenna; for example, a whole-body antenna designed as a circular waveguide antenna. In one suitable embodiment of a high-frequency system, two different high-frequency antennas are used for producing an image; namely, a high-frequency transmitting antenna and a high-frequency receiving antenna. The transmission and reception functions may alternatively be provided by a single antenna, as disclosed in European Patent B-0 073 375. A suitable antenna arrangement is also disclosed in the co-pending United States patent application entitled "High-Frequency Apparatus for Nuclear Spin Tomography," assigned to the same assignees as the present invention, the disclosure of which is incorporated herein by reference.

Antenna arrangements of known high-frequency systems for nuclear spin tomography successfully achieve a desired coupling between the biological tissue of a body to be examined and the antenna arrangement through a magnetic field (the B-field); however, these arrangements also exhibit an undesired coupling through an electric field (the E-field). This electric field coupling can lead to undesired heating of the surface of the biological tissue during transmission, particularly on the surface of the skin. During reception, the electric field coupling produces additional disturbing therma in the form of noises in the high-frequency signals produced by nuclear spin excitation, thereby worsening the signal-to-noise ratio of the high-frequency signals. It is thus desirable to minimize electric field coupling as much as possible, limiting it to a bearable amount.

To this end, the aforementioned European Patent A-0 047 065 discloses a shielding means, known as a Faraday shield, disposed between the antenna arrangement and the body to be examined. The shield consists of a wire frame of electrically conductive material, such as copper, formed from a plurality of annular wire loops spaced apart from each other on the outside of a support tube which surrounds the body to be examined, with the loops electrically connected to one another by pieces of copper. The shield is thus a quasi-mesh-like construction having a predetermined mesh width. In this arrangement, however, the electrically conductive wires of the wire frame must be spaced relatively far from each other to avoid influencing the B-field. As a result, suppression of electric field coupling is poorly pronounced.

SUMMARY OF THE INVENTION

The object of the present inventions is to provide a high-frequency antenna arrangement for a tomography apparatus in which electric field coupling is significantly suppressed without substantially impairing the B-field. This object is achieved using at least one plate-shaped or layer-shaped shield made of an insulating dielectric material having a relative dielectric constant $\epsilon_r$ of at least 50 and having a dielectric loss factor $\tan \delta$ of at most $2.5 \times 10^{-2}$. The shield is arranged at least in a region of increased field strength of an electric field prevailing on the antenna arrangement.

The shield of the present invention ensures that the undesired electric field is concentrated in the dielectric shielding element due to the predetermined physical properties of the shield. The electric field is present only with a correspondingly weakened field strength on the surface of the biological body to be examined. Accordingly, the dielectric shield can be considered an "artificial ideal skin." Undesirable influencing of the B-field is advantageously avoided due to the electrically non-conductive character of the shielding material. Moreover, possible detuning of the high-frequency antenna by adjacent tissue of a biological body due to undesired electric field coupling is suppressed.

Advantageous application of the dielectric shielding element according to the present invention is not limited to local coils. For example, such a shield is useful in whole-body antennas which also require shielding of undesired electric fields without affecting B-fields. Furthermore, corresponding electric field shielding measures can also be provided for conductors which extend antennas of the antenna arrangements and which are positioned close to the body to be imaged.

DETAILED DESCRIPTION

The present invention is described in detail below with reference to the drawings; parts common to more than one figure .are identified with like reference numbers. Since high-frequency-systems for nuclear spin tomography are generally known in the art, knowledge of the customary embodiments of such systems is assumed. Parts not shown in the figures are well-known in the art. A high-frequency nuclear spin tomograph generally includes a high-frequency transmitter and a high-frequency receiver. In a first embodiment, one high-frequency antenna is provided for the transmitter and a second, distinct high-frequency antenna is provided for the receiver. In an alternate embodiment, a single antenna may be used for both transmission and reception. Individual antennas or antenna systems known in the art may be used in a system according to the present invention. The antenna arrangement may advantageously include a high-frequency feed conductor. For such implementations, only those parts of the feed conductor which are disposed close to the body and which produce undesired electric fields are addressed herein.

Figure 1:
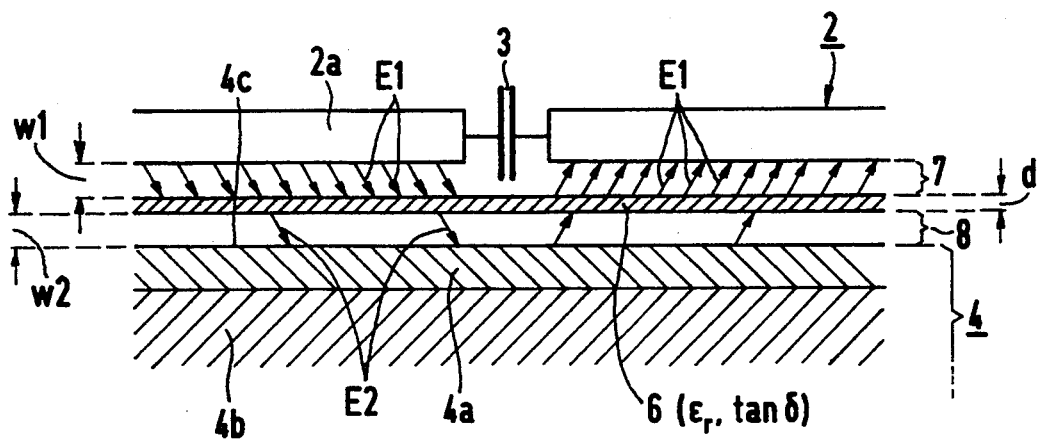
FIG. 1 is a side view of an embodiment of an antenna arrangement for a high-frequency nuclear spin tomograph according to the present invention.
Figure 2:
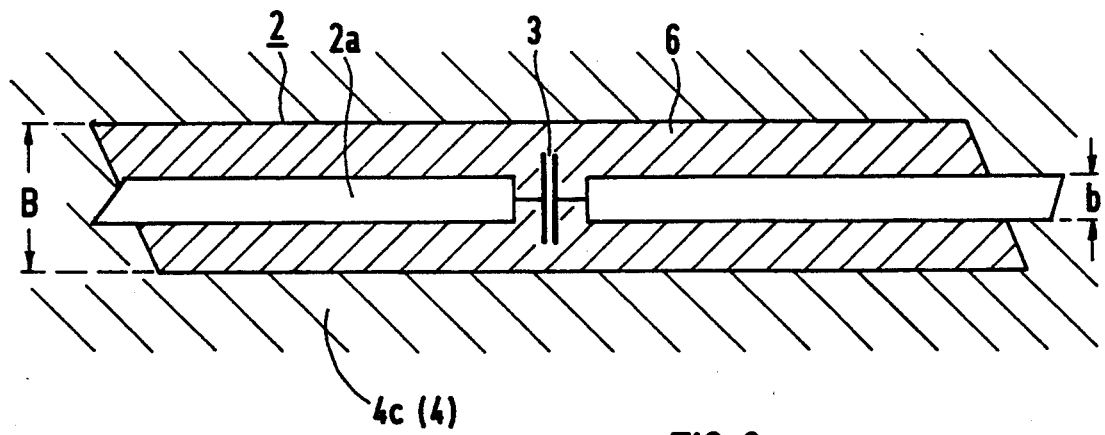
FIG. 2 is a top view of the antenna arrangement of FIG. 1.

FIGS. 1 and 2 present a side view and a top view, respectively, of an embodiment of an antenna arrangement according to the present invention in which a local coil is provided as a receiving antenna. A portion of the local coil 2 includes at least one conductor loop 2a. The conductor loop is closed in at least one point of separation by a capacitor 3, thus forming a resonant antenna circuit. The local coil 2 is arranged above a biological body 4 or part thereof which is to be imaged. The body 4 has a skin and fat region 4a arranged close to its surface, with a muscular tissue region 4b lying beneath.

In a device configured as shown, a particularly strong electric field (E-field) E1, indicated by a group of lines with arrow heads, is produced on the local coil 2 in the area of the capacitor 3; that is, the E-field has a comparatively higher field strength there than in other regions of the local coil 2. Accordingly, the embodiment of the present invention provides an electric field shielding of the body 4 from the local coil 2 at least in this region. The electric field shielding generally reduces the electric field strength at the surface 4c of the skin and fat region 4a of the body 4, and thus reduces or limits electric field coupling between the local coil 2 and the body 4.

The desired electric field shielding is provided by a shield having at least one shielding element 6 arranged between the local coil 2 and the body surface 4c. The shielding element 6 ideally consists of a special dielectric such as that described in Lexikon der Physik, at 266-268 (H. Franke ed., 3d ed., Stuttgart 1969). The shielding element 6 is advantageously separated from the local coil 2 and the body 4 by narrow gaps 7 and 8, respectively. The widths w1 and w2 of these gaps 7, 8 may range from a few millimeters to several centimeters. Alternatively, the shielding element 6 may be located directly on the local coil 2 or on the body surface 4c, particularly if no detuning problems are expected.

The shielding element 6 may be shaped, for example, as a flat or curved plate with a thickness d between 0.1 mm and 5 cm. The upper limit for the thickness d is generally not critical in view of the coil-tissue spacing, while the lower limit is determined by the degree of shielding action required. The shielding element 6 may also be formed as a corresponding thick layer on a suitable support member. The material for the plate-shaped or layer-shaped shielding element 6 should be of an insulating nature; that is, it should exhibit a specific resistance of more than $10^8$ ohms $\times$ meter and, in particular, have a high relative dielectric constant (or permitivity number) $\epsilon_r$ of at least 50 and preferably more than 100. Such characteristics will ensure that the electric field E2 on the surface of the body, also indicated by individual lines with arrows in FIG. 1, is significantly less than the electric field E1 between the shielding element 6 and the local coil 2. The relative spacing of the arrow lines representing the fields E1 and E2 indicates their different field strengths. In addition, the material of the shielding element 6 should have a small dielectric loss factor tan $\delta$ of at most $2.5 \times 10^{-2}$, and preferably at most $1 \times 10^{-3}$. Such a composition will be substantially free from loss, thus minimizing any undesired noise produced for the local coil.

Materials which satisfy the conditions described above with respect to the desired relative dielectric constant $\epsilon_r$ and the dielectric loss factor tan $\delta$ include ceramic dielectrics of a type used for high-frequency capacitors. Such dielectrics are disclosed in *German Standard for Ceramic and Glass Insulating Materials*, "DIN VDE 0335," parts 1, 3 (February 1988) and in the corresponding international Standard "IEC 672-1 and 672-3" under the group designation "C-300." Suitable ceramic masses consisting; of titanates with perovskite-like crystal structures are also described in *Hutte—des*

*Ingenieurstaschenbuch*, Vol. Hütte IV A: Electrical Engineering, Part A, at 802–803, (28th ed. 1957). Oxide ceramic materials are particularly well-suited to this application, including pyrooxides or piezooxides such as $TiO_2$, $BaTiO_3$, $(Ba,Sr)TiO_3$, $PbTiO_3$, $PbZrO_3$ or $Pb(Zr,Ti)O_3$. Corresponding ceramic materials are used, for instance, as plates of thicknesses within the millimeter range and with diameters of a few centimeters for the production of plate capacitors. The ceramic surfaces required for use as shielding elements can then be cut from corresponding standard sizes of such plates and assembled from several shielding elements in accordance with the shape of the shielding element or of the structure.

Referring to FIG. 2, to ensure sufficient electric field shielding of the body 4, and in particular the surface of the body 4c, the shielding element 6 preferably has a width B which is comparatively greater than the width b of the local coil 2 or its conductor parts 2a and, in particular, of its capacitor 3. In general, sufficient shielding will be provided if the shielding element 6 is implemented as a strip extending parallel to the local coil or to parts thereof, the width of which is about 3 to 5 times greater than the corresponding dimension of the associated part of the local coil 2 and, in particular, of the capacitor 3. The shielding element 6 or a shielding structure including several such elements can, however, also be developed with a larger surface area. Covering the region around the capacitor 3 of the local coil 2 is of particular importance since the highest electric field strength prevails at that point. In other words, a shielding of other regions of the local coil 2 exhibiting comparatively lower electric field strength could possibly be dispensed with.

The shielding approach of the present invention is not limited merely to a local coil which receives high-frequency nuclear spin signals. Corresponding measures can be provided, either in addition to or only for, a transmitting antenna in order to shield a body 4 from the antenna, at least in regions of high electric field strength.

Figure 3:
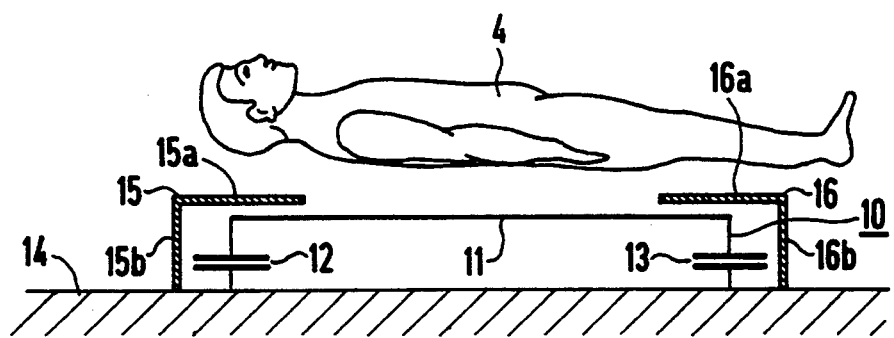
FIG. 3 is a longitudinal section view of another embodiment of an antenna arrangement according to the present invention.

Likewise, the present invention may be advantageously applied where a receiving antenna also serves as a transmitting antenna. Such an embodiment is shown in FIG. 3. As shown in longitudinal section through a portion of a high-frequency nuclear spin tomography, the antenna arrangement includes a wholebody resonator 10. A whole-body resonator of this type is disclosed by European Patent B-0 073 375, and contains a conductor element 11 extending in an axial direction and which is connected at its ends by capacitors 12 and 13 to an envelope tube 14. As in the previous embodiment, the electric field of the antenna arrangement is greatest in the region of these capacitors; therefore, shielding elements 15, 16 are arranged at least in those areas to shield the body 4. The shielding elements 15 and 16 are L-shaped as seen in cross-section, and each has an axial part 15a, 16a and an end radial part 15b, 16b.

Figure 4:
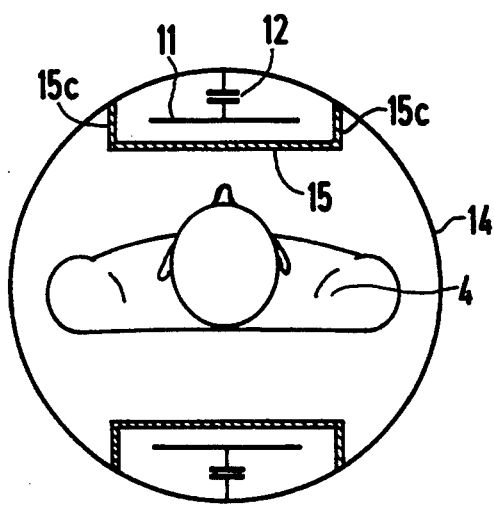
FIG. 4 is an end view of the antenna arrangement of FIG. 3.

FIG. 4 shows an end view of the embodiment shown in FIG. 3, as viewed from the side having the shielding element 15. As can be seen, the shielding elements 15, 16 may also have lateral shielding parts 15c. Any shielding elements to be associated with other capacitors can be shaped in a corresponding manner.

Figure 5:
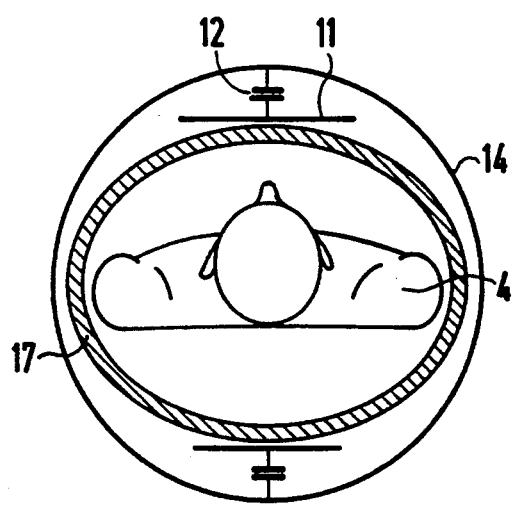
FIG. 5 is an end view of yet another embodiment of an antenna arrangement according to the present invention.

FIG. 5 shows an end view of yet another embodiment of the present invention. Here, the shielding element 17 completely surrounds a body 4 to be examined, at least in its end regions of high electric field strength near the capacitors. As a variation of this embodiment, the shielding element 17 could only partially surround the body 4 to be imaged.

Figure 6:
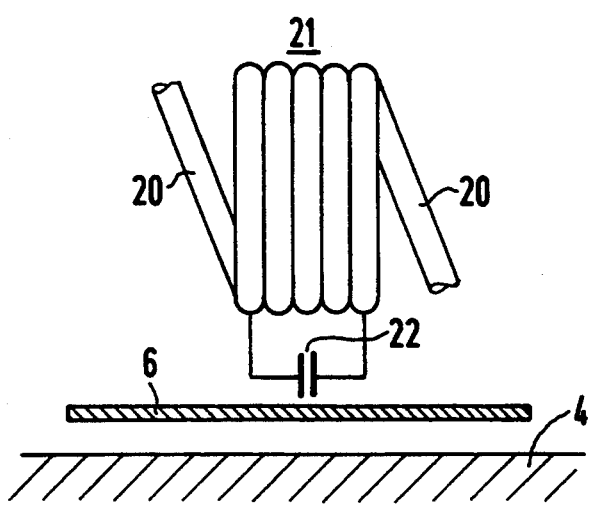
FIG. 6 is a side view of a feed conductor for use with an antenna arrangement according to present invention.

An antenna arrangement of a high-frequency nuclear spin tomograph according to the present invention may also include feed conductors leading to the associated antenna or antenna system. A feed conductor for such a device, like an antenna, may exhibit regions of increased electric field strength which, if the feed conductor extends in the vicinity of a body to be examined, may lead to an undesired electric field coupling between the body and the feed conductor. FIG. 6 shows an embodiment of a shielding element that addresses this problem. As shown, a feed conductor 20 includes at least one decoupling element 21 formed, for example, as a sheath wave barrier. Such a decoupling element is disclosed in Federal Republic of Germany OS 41 13 120 and the above-referenced article from "ntz Archiv." The decoupling element 21 includes a capacitor 22 on which an increased electric field prevails. According to the present invention, a body 4 to be examined is substantially decoupled from this electric field by the plate-shaped or layer-shaped shielding element 6.

While the present invention has been described with reference to specific embodiments, it will be apparent to those skilled in the art that many modifications and variations are possible. Accordingly, the present invention embraces all alternatives, modifications and variations that fall within the spirit and scope of the appended claims, as well as all equivalents thereof.

What is claimed:

1. A high-frequency apparatus for nuclear spin tomography, comprising:
    (a) a high-frequency antenna arrangement for exciting nuclear spin in a biological body to be examined and for receiving high frequency signals caused by the nuclear spin excitation; and
    (b) a shield disposed between said antenna arrangement and the body to delimit an electric field coupling, said shield including a shielding element having an insulating dielectric material with a relative dielectric constant $\epsilon_r$ of at least 50 and a dielectric loss factor $\tan \delta$ of at most $2.5 \times 10^{-2}$, wherein said shielding element is located at least in a region of increased field strength of an electric field prevailing on said antenna arrangement.

2. The high-frequency apparatus of claim 1, wherein said dielectric material has a relative dielectric constant $\epsilon_r$ of more than 100.

3. The high-frequency apparatus of claim 1, wherein said dielectric material has a dielectric loss factor $\tan \delta$ of at most $1 \times 10^{-3}$.

4. The high-frequency apparatus of claim 1, wherein said shielding element is physically separated from said antenna arrangement and from a surface of the body to be examined.

5. The high-frequency apparatus of claim 1, wherein said shield comprises a plurality of shielding elements coupled to one another.

6. The high-frequency apparatus of claim 1, wherein said antenna arrangement comprises a local coil.

7. The high-frequency apparatus of claim 1, wherein said antenna arrangement comprises a whole-body resonator.

8. The high-frequency apparatus of claim 1, wherein said antenna arrangement includes a feed conductor, said feed conductor having a conductor extending in a vicinity of the body to be examined, said conductor including a structural part exhibiting a region of increased field strength of an electric field, wherein said shielding element is arranged in said region.

9. The high-frequency system of claim 1, wherein said region of increased field strength of an electric field prevailing on said antenna arrangement exists in an area of a capacitor.

10. The high-frequency apparatus of claim 1, wherein said dielectric material comprises oxide-ceramic.

* * * * *